United States Patent
Chen

(10) Patent No.: US 10,274,812 B1
(45) Date of Patent: Apr. 30, 2019

(54) CAMERA MODULE

(71) Applicants: TRIPLE WIN TECHNOLOGY(SHENZHEN) CO. LTD., Shenzhen (CN); HON HAI PRECISION INDUSTRY CO., LTD., New Taipei (TW)

(72) Inventor: Shin-Wen Chen, New Taipei (TW)

(73) Assignees: TRIPLE WIN TECHNOLOGY(SHENZHEN) CO. LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/832,596

(22) Filed: Dec. 5, 2017

(30) Foreign Application Priority Data

Oct. 31, 2017 (TW) .............................. 106137670 A

(51) Int. Cl.
   *G03B 17/00* (2006.01)
   *G03B 17/12* (2006.01)
   *H05K 1/18* (2006.01)
   *G02B 7/02* (2006.01)
   *H04N 5/225* (2006.01)

(52) U.S. Cl.
   CPC ............. *G03B 17/12* (2013.01); *G02B 7/025* (2013.01); *H04N 5/2254* (2013.01); *H05K 1/181* (2013.01); *H05K 2201/10015* (2013.01); *H05K 2201/10121* (2013.01); *H05K 2201/10151* (2013.01); *H05K 2201/10409* (2013.01); *H05K 2201/10424* (2013.01)

(58) Field of Classification Search
   CPC ....................................................... G03B 17/14
   USPC .......................................................... 396/533
   See application file for complete search history.

(56) References Cited

U.S. PATENT DOCUMENTS

| | | | | |
|---|---|---|---|---|
| 5,754,350 | A * | 5/1998 | Sato ........................ | G02B 7/026 359/808 |
| 9,864,159 | B2 * | 1/2018 | Kimura ................... | G02B 7/025 |
| 9,986,136 | B2 * | 5/2018 | Newiger ............... | H04N 5/2252 |
| 2004/0183936 | A1 * | 9/2004 | Kim ........................ | G02B 7/022 348/340 |
| 2005/0248684 | A1 * | 11/2005 | Machida ................ | G03B 17/00 348/373 |

(Continued)

FOREIGN PATENT DOCUMENTS

CN    203490450 U    3/2014
CN    205992113 U    3/2017

(Continued)

*Primary Examiner* — Clayton E Laballe
*Assistant Examiner* — Kevin Butler
(74) *Attorney, Agent, or Firm* — ScienBiziP, P.C.

(57) ABSTRACT

A durable camera module comprises a lens holder and a lens barrel. An opening is defined in the lens holder. The opening passes through the lens holder along an axial direction of the lens holder. At least one notch is defined in a side wall of the lens holder. The at least one notch extends radially through the side wall of the lens holder. The lens barrel is received in the opening. A first adhesive layer is formed between the lens barrel and lens holder. The first adhesive layer is positioned at an end of the lens holder and surrounds the lens barrel. A second adhesive layer is formed in each of the at least one notch, the second adhesive layer is bonded to the lens barrel.

10 Claims, 4 Drawing Sheets

(56) References Cited

U.S. PATENT DOCUMENTS

| | | | | |
|---|---|---|---|---|
| 2006/0140610 A1* | 6/2006 | Chang | G02B 7/021 | 396/89 |
| 2007/0058964 A1* | 3/2007 | Shangguan | G03B 3/02 | 396/144 |
| 2008/0055752 A1* | 3/2008 | Ishizawa | G03B 3/10 | 359/824 |
| 2009/0033789 A1* | 2/2009 | Lin | G02B 7/02 | 348/374 |
| 2010/0103540 A1* | 4/2010 | An | G02B 7/021 | 359/819 |
| 2011/0013295 A1* | 1/2011 | Chou | G02B 7/021 | 359/819 |
| 2011/0063739 A1* | 3/2011 | Hirata | G02B 7/021 | 359/819 |
| 2011/0090581 A1* | 4/2011 | Lee | G02B 7/022 | 359/829 |
| 2011/0096424 A1* | 4/2011 | Lee | G02B 7/021 | 359/829 |
| 2011/0096425 A1* | 4/2011 | Lee | G02B 7/021 | 359/829 |
| 2011/0097073 A1* | 4/2011 | Lee | G03B 17/00 | 396/533 |
| 2011/0286737 A1* | 11/2011 | Kim | G03B 17/02 | 396/533 |
| 2012/0105983 A1* | 5/2012 | Huang | G02B 7/022 | 359/819 |
| 2013/0063655 A1 | 3/2013 | Hsu | | |
| 2013/0258502 A1* | 10/2013 | Lai | G02B 7/021 | 359/819 |
| 2013/0342748 A1* | 12/2013 | Ma | G02B 7/026 | 348/335 |
| 2015/0131272 A1* | 5/2015 | Walker | F21S 8/00 | 362/154 |
| 2015/0260942 A1* | 9/2015 | Yan | G02B 7/021 | 359/771 |
| 2017/0310861 A1* | 10/2017 | Wang | H04N 5/2254 | |

FOREIGN PATENT DOCUMENTS

| | | |
|---|---|---|
| TW | 200727063 A | 7/2007 |
| TW | 201313011 A | 3/2013 |

* cited by examiner

CAMERA MODULE

FIELD

The subject matter relates to a camera module.

BACKGROUND

A camera module generally comprises a substrate, an image sensor, a lens holder, and a lens barrel. The image sensor and the lens holder are fixed on the substrate. The lens barrel is received in the lens holder. The lens barrel and the lens holder are usually fixed by glue. However, the adhesion force between the lens barrel and the lens holder is not strong enough, which may cause the lens barrel to be separated from the lens holder during transport, assembling, or reliability testing, resulting in deterioration of the image quality of camera module. Improvements in the art are preferred.

BRIEF DESCRIPTION OF THE DRAWINGS

Implementations of the present technology will now be described, by way of example only, with reference to the attached figures, wherein.

DETAILED DESCRIPTION

Figure 1:
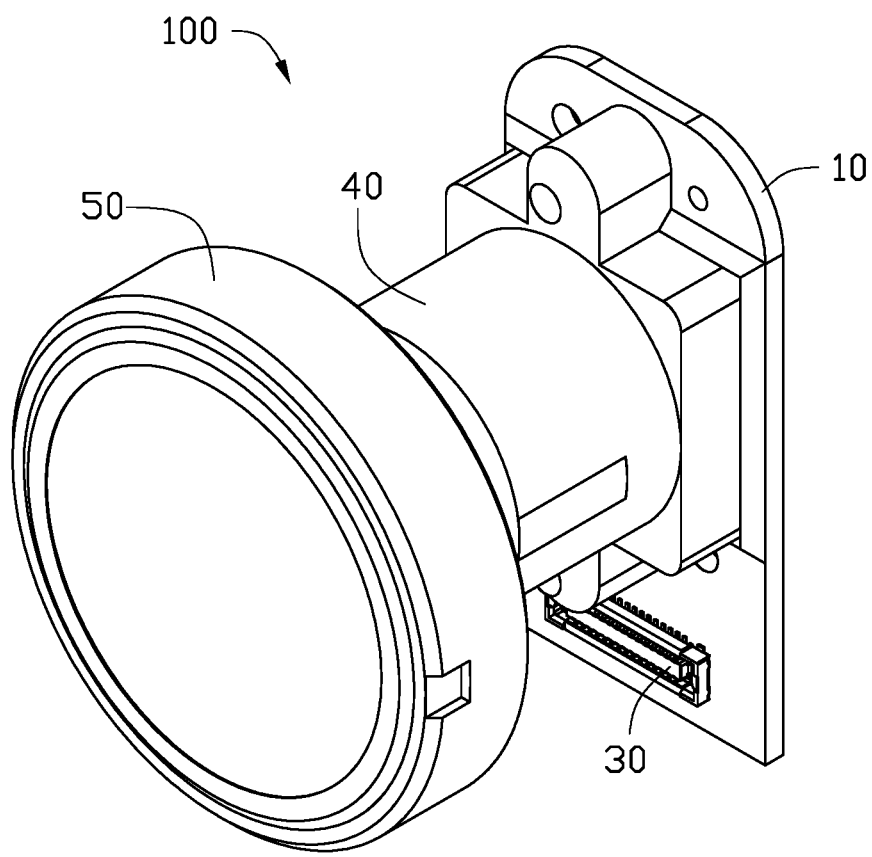
FIG. 1 is a diagram of a first exemplary embodiment of a camera module.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details.

In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

One definition that applies throughout this disclosure will now be presented.

The term "substantially" is defined to be essentially conforming to the particular dimension, shape, or other feature that the term modifies, such that the component need not be exact. For example, "substantially rectangular" means that the object resembles a rectangle, but can have one or more deviations from a true rectangle.

The term "comprising," when utilized, means "including, but not necessarily limited to"; it specifically indicates open-ended inclusion or membership in the so-described combination, assembly, series, and the like.

Figure 2:
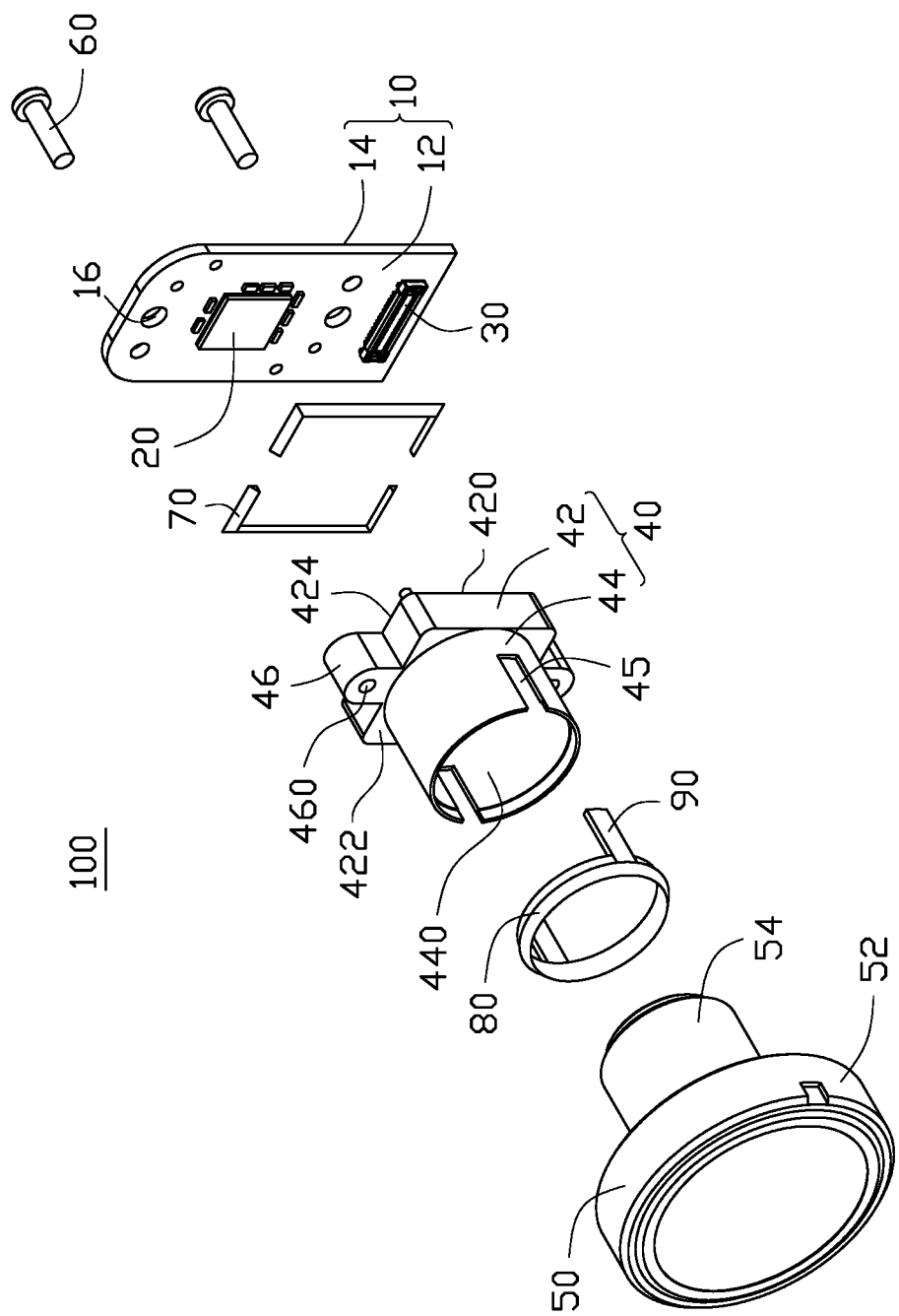
FIG. 2 is an exploded diagram of the camera module of FIG. 1.

FIGS. 1-2 illustrate a first exemplary embodiment of a camera module 100. The camera module 100 comprises a substrate 10, an image sensor 20, a capacitor 30, a lens holder 40, and a lens barrel 50.

The substrate 10 is a circuit board. The substrate 10 comprises an upper surface 12 and a lower surface 14. The upper surface 12 and the lower surface 14 are opposite to each other. In the exemplary embodiment, the upper surface 12 is parallel to the lower surface 14. Two mounting holes 16 are defined in the substrate 10.

The image sensor 20 is positioned on the upper surface 12, and is electrically connected to the substrate 10.

The capacitor 30 is positioned on the upper surface 12, and is electrically connected to the substrate 10.

The lens holder 40 is fixed on the upper surface 12. In the exemplary embodiment, the lens holder 40 is made of plastic. The image sensor 20 is received in the lens holder 40. The lens holder 40 comprises a base 42 and a housing portion 44. The housing portion 44 is connected to the base 42.

The base 42 is substantially rectangular. The base 42 comprises a top surface 422 and a bottom surface 424. The top surface 422 and the bottom surface 424 are opposite to each other. In the exemplary embodiment, the top surface 422 is parallel to the bottom surface 424. A first opening 420 is defined in the base 42. The first opening 420 extends through the top surface 422 and the bottom surface 424. The first opening 420 is a rectangular. The first opening 420 receives the image sensor 20.

The housing portion 44 is substantially cylindrical. A second opening 440 is defined in the housing portion 44. The housing portion 44 receives the lens barrel 50. The second opening 440 extends through the housing portion 44. The second opening 440 is cylindrical. The second opening 440 connects with the first opening 420.

At least one notch 45 is defined in the housing portion 44. Each notch 45 extends radially through the sidewall of the housing portion 44. Each notch 45 is defined at one end of the housing portion 44 away from the base 42. In the exemplary embodiment, the notch 45 is rectangular, and does not penetrate the other end of the housing portion 44 near the base 42.

The lens holder 40 also comprises two fixing portions 46. The two fixing portions 46 are positioned on opposite sides of the base 42. A through hole 460 is defined in the each of the fixing portions 46. The shape, the size, and the position of the through hole 460 may substantially correspond to the shape, the size, and the position, respectively, of the mounting hole 16.

The lens barrel 50 is made of a metallic material. The lens barrel 50 comprises a first portion 52 and a second portion 54. The first portion 52 and the second portion 54 are cylindrical. The second portion 54 connects with the first portion 52. The second portion 54 is perpendicular to the first portion 52. A diameter of the second portion 54 is smaller than a diameter of the first portion 52. The second portion 54 is received in the second opening 440, and has a shape corresponding to that of the second opening 440.

The camera module 100 also comprises two screws 60. The two screws 60 can lock the lens holder 40 to the substrate 10.

During assembly, the lens holder 40 is fixed to the substrate 10 first. At this time, the image sensor 20 and the capacitor 30 are fixed and electrically connected to the substrate 10. The two through holes 460 are aligned with the two mounting holes 16, and the screws 60 go through the mounting holes 16 and the through holes 460, thus, the substrate 10 and the lens holder 40 are fixed together. At this time, the image sensor 20 is received in the first opening 420, and is located at a central position of the first opening 420. Glue is coated onto the periphery of the base 42 of the substrate 10 to form a third adhesive layer 70. The third adhesive layer 70 surrounds the base 42 and fills a gap between the base 42 and the substrate 10 for sealing between the lens holder 40 and the substrate 10. Then, the second portion 54 is placed in the second opening 440, and a position of the lens barrel 50 is adjusted that the center axis of the lens barrel 50 is aligned with the middle of the imaging region of the image sensor 20. Glue is coated onto an end of the housing portion 44 away from the base 42 to form a first adhesive layer 80. The first adhesive layer 80 is substantially annular. The first adhesive layer 80 surrounds the second portion 54, and is adhered to the second portion 54. Finally, glue is infilled in each notch 45 to form a second adhesive layer 90, thereby completing the assembly of the camera module 100. The second adhesive layer 90 is substantially stripe-shaped. In the exemplary embodiment, the second adhesive layer 90 is connected to the first adhesive layer 80. The second adhesive layer 90 is perpendicular to the first adhesive layer 80.

Figure 3:
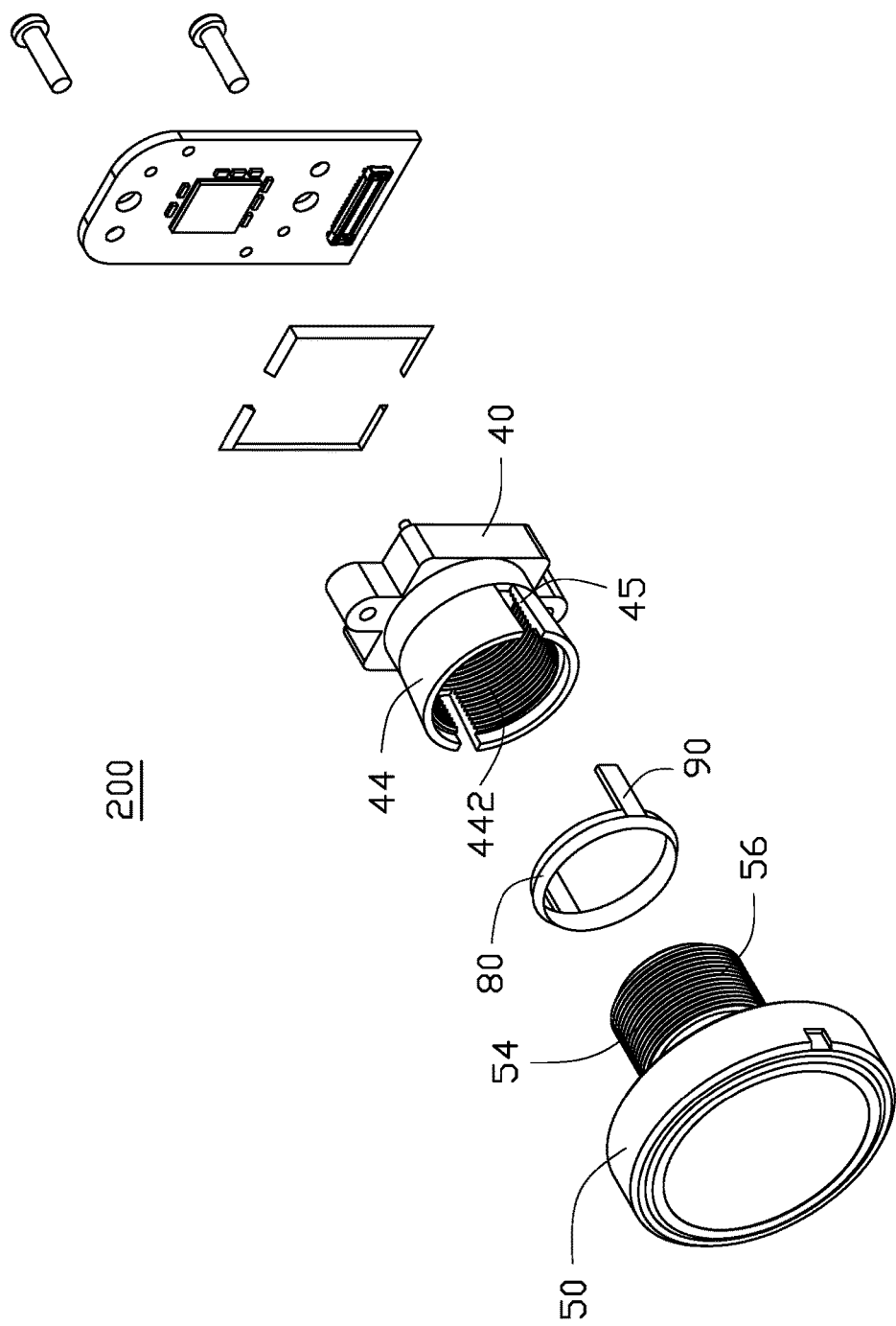
FIG. 3 is an exploded diagram of a second exemplary embodiment of a camera module.

Referring to FIG. 3, a camera module 200 of a second exemplary embodiment is provided. In the camera module 200, a first screw thread 56 is formed on the outer surface of the second portion 54 of the lens barrel 50. The first screw thread 56 surrounds the second portion 54. A second screw thread 442 is formed on the inner surface of the housing portion 44. The second screw thread 442 is positioned at the entire inner surface of the housing portion 44. The first screw thread 56 is screwed with the second screw thread 442 to fix the lens barrel 50 in the lens holder 40.

Figure 4:
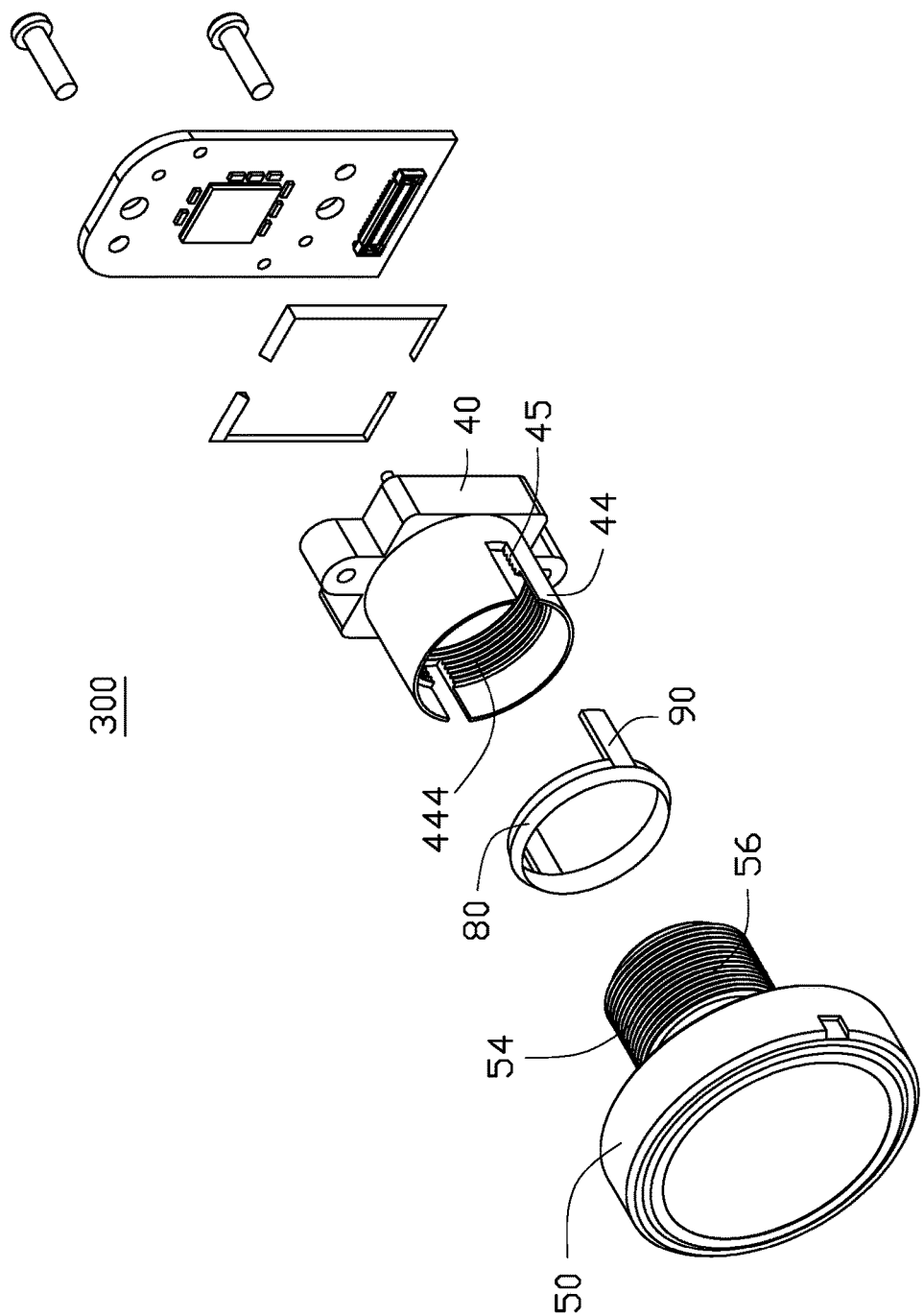
FIG. 4 is an exploded diagram of a third exemplary embodiment of a camera module.

Referring to FIG. 4, a camera module 300 of a third exemplary embodiment is provided. In the camera module 300, a first screw thread 56 is formed on the outer surface of the second portion 54 of the lens barrel 50. The first screw thread 56 surrounds the second portion 54. A third screw thread 444 is formed on the inner surface of the housing portion 44. The third screw thread 444 is only positioned at a portion of inner surface of the housing portion 44. The first screw thread 56 is screwed with the third screw thread 444 to fix the lens barrel 50 in the lens holder 40.

In the camera modules 100, 200, 300, the second adhesive layer 90 and the first adhesive layer 80 cooperatively enhance a bonding strength between the lens barrel 50 and the lens holder 40. In addition, the at least one notch 45 can expand along a radial direction of the lens holder 40, when the lens holder 40 is connected to the lens barrel 50, which decreases a torsion between the lens barrel 50 and the lens holder 40.

The embodiments shown and described above are only examples. Many details are often found in the art such as the other features. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A camera module comprising:
   a lens holder defining an opening and at least one notch, the opening passing through the lens holder along an axial direction of the lens holder, each of the at least one notch passing through a sidewall of the lens holder along a radial direction of the lens holder; and
   a lens barrel, the lens barrel received in the opening;
   wherein a first adhesive layer is formed between the lens barrel and lens holder, the first adhesive layer is positioned at an end of the lens holder and surrounds the lens barrel, a second adhesive layer is formed in each of the at least one notch, the second adhesive layer is bonded to the lens barrel, and the second adhesive layer is adhered to the first adhesive layer.

2. The camera module of claim 1, wherein the first adhesive layer is annular, and the second adhesive layer is stripe-shaped.

3. The camera module of claim 1, wherein a first screw thread is formed on an outer surface of the lens barrel, a second screw thread is formed on an inner surface of the lens holder, the second screw thread is positioned on an entire inner surface of the lens holder, and the first thread is screwed with the second screw thread.

4. The camera module of claim 1, wherein a first screw thread is formed on an outer surface of the lens barrel, a third screw thread is formed on an inner surface of the lens holder, the third screw thread is only positioned at a portion of the inner surface of the lens holder, and the first thread is screwed with the third screw thread.

5. The camera module of claim 1, further comprising a substrate, wherein the lens holder is fixed on the substrate.

6. The camera module of claim 5, wherein the lens holder is fixed to the substrate by screw.

7. The camera module of claim 5, further comprising an image sensor, wherein the image sensor is fixed on the substrate.

8. The camera module of claim 5, further comprising a capacitor, wherein the image sensor is fixed on the substrate, and the capacitor is electrically connected with the substrate.

9. The camera module of claim 5, wherein the substrate is a circuit board.

10. The camera module of claim 1, wherein a third adhesive layer is formed between the lens holder and the substrate, and the third adhesive layer surrounds the lens holder and fills a gap between the lens holder and the substrate.

* * * * *